United States Patent [19]

Hisa

[11] Patent Number: 5,115,295
[45] Date of Patent: May 19, 1992

[54] PHOTODETECTOR DEVICE

[75] Inventor: Yoshihiro Hisa, Itami, Japan

[73] Assignee: Mitsubishi Denki Kabushiki Kaisha, Japan

[21] Appl. No.: 600,180

[22] Filed: Oct. 19, 1990

Related U.S. Application Data

[63] Continuation-in-part of Ser. No. 554,405, Jul. 19, 1990, abandoned.

[30] Foreign Application Priority Data

Oct. 31, 1989 [JP] Japan .................... 1-285221
Oct. 31, 1989 [JP] Japan .................... 1-285221

[51] Int. Cl.$^5$ .................... H01L 27/14; H01L 31/00; H01L 29/06; H01L 29/161
[52] U.S. Cl. .................... 357/30; 357/32; 357/55; 357/61; 357/20
[58] Field of Search .................... 357/30 R, 30 B, 30 L, 357/30 D, 20, 30, 32, 55, 61

[56] References Cited

U.S. PATENT DOCUMENTS

| | | | |
|---|---|---|---|
| 4,275,407 | 6/1981 | Lorenze | 357/30 |
| 4,442,310 | 4/1984 | Carlson et al. | 136/256 |
| 4,596,930 | 6/1986 | Steil et al. | 250/332 |
| 4,951,106 | 8/1990 | Blouke | 357/30 |
| 4,972,244 | 11/1990 | Buffet et al. | 357/30 |
| 4,999,694 | 3/1991 | Austin et al. | 357/30 |

FOREIGN PATENT DOCUMENTS

| | | | |
|---|---|---|---|
| 0083986 | 7/1983 | European Pat. Off. | |
| A304335 | 2/1989 | European Pat. Off. | 357/30 |
| 61-152065 | 7/1986 | Japan | 357/30 |
| 62-36858 | 2/1987 | Japan | 357/30 |
| 62-104163 | 5/1987 | Japan | 357/30 |
| 63-133580 | 6/1988 | Japan | 357/30 |
| 63-273365 | 11/1988 | Japan | 357/30 |
| 29180 | 1/1990 | Japan | 357/30 |
| 8707083 | 11/1987 | PCT Int'l Appl. | |

Primary Examiner—Andrew J. James
Assistant Examiner—Cyntheia S. Deal
Attorney, Agent, or Firm—Leydig, Voit & Mayer

[57] ABSTRACT

A photodetector device of a rear surface incident type includes a semi-insulating substrate transparent to light incident from the rear surface, a plurality of second conductivity type semiconductor regions disposed on the substrate in a first conductivity type semiconductor layer, a conductive light absorption layer disposed on at least one of the second conductivity type semiconductor regions, metal electrodes having a high reflectance of the incident light disposed on the light absorption layer and the second conductivity type semiconductor regions, and protection layers disposed on the first conductivity type semiconductor layer.

4 Claims, 9 Drawing Sheets

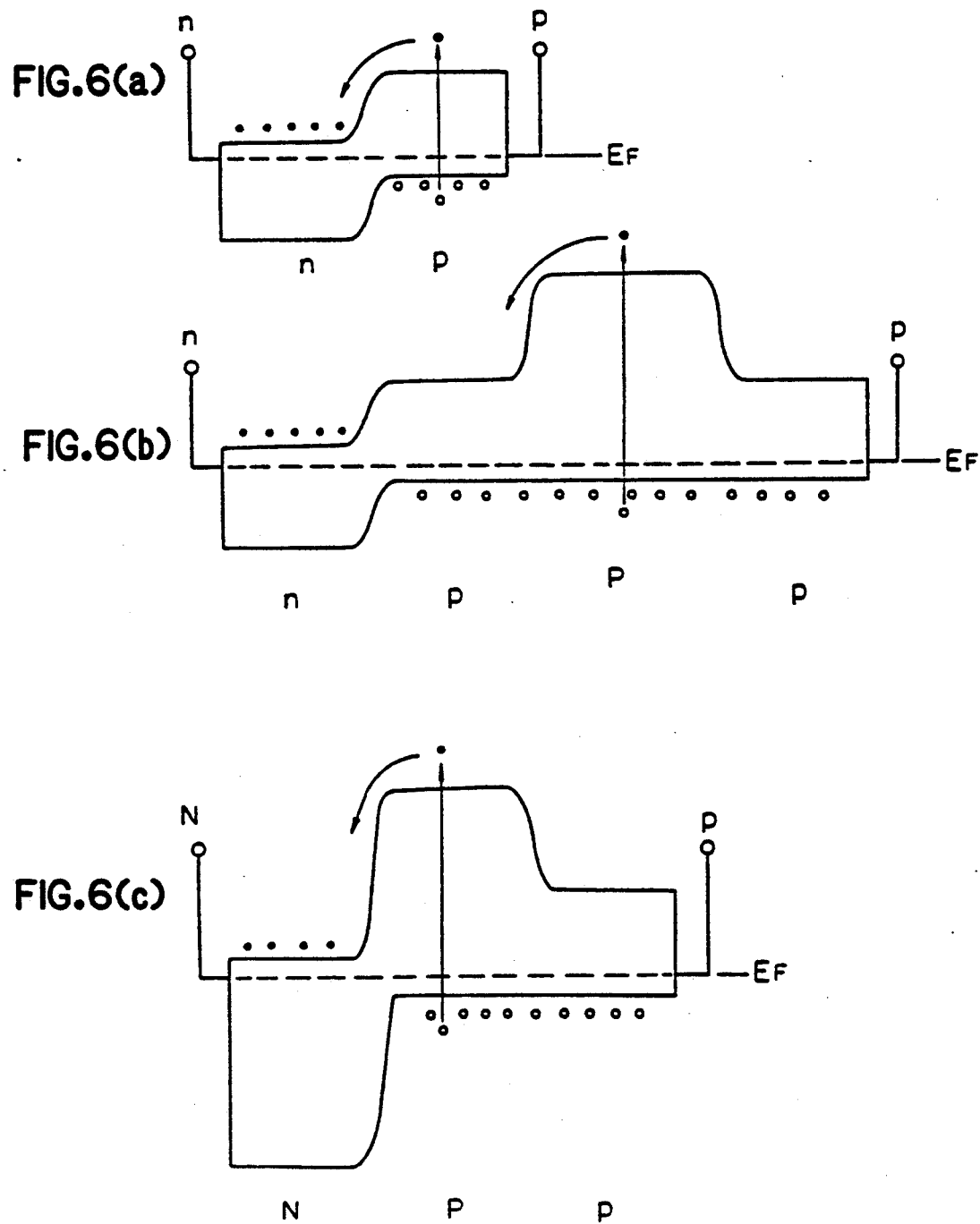

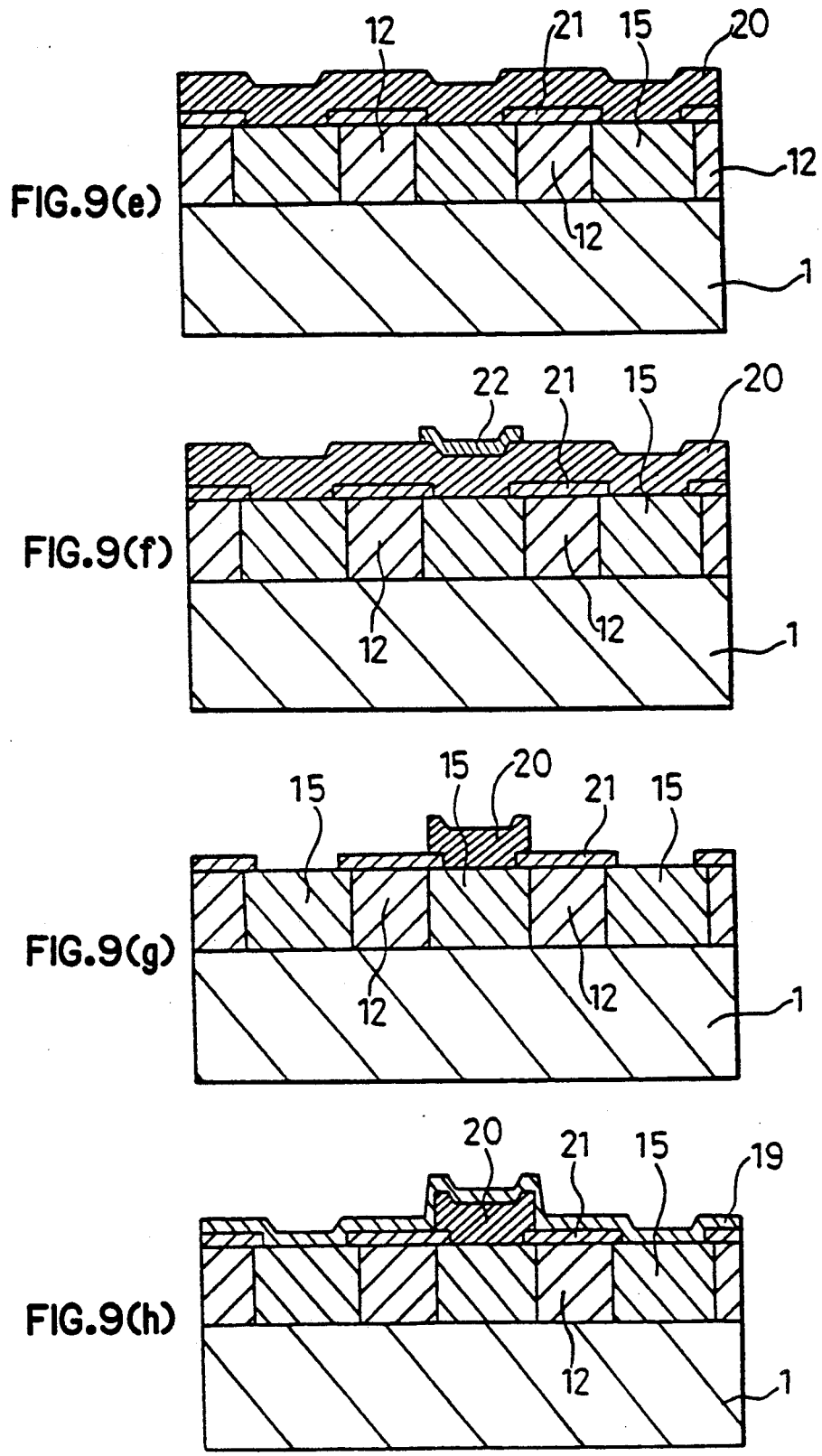

PHOTODETECTOR DEVICE

This application is a continuation-in-part of application Ser. No. 07/554,405, filed Jul. 19, 1990 now abandoned.

FIELD OF THE INVENTION

The present invention relates to a photodetector of a rear surface incident type including a pholovoltaic array. More particularly, the invention relates to a photodetector device that easily senses whether the temperature of a target is high or low.

BACKGROUND OF THE INVENTION

A photodetector disclosed in Japanese Published Patent Application 2-9180 is Patent described as follows.

FIG. 5(a) shows a plan view of the above-described prior art photodetector and FIG. 5(b) shows a crosssectional view taken along line A—A' of FIG. 5(a). In FIG. 5(a), reference numeral 1 designates a high resistance and semi-insulating substrate comprising CdTe. Reference numeral 11 designates a first semiconductor layer comprising p type $Cd_{0.3}Hg_{0.7}Te$. Reference numeral 12 designates a second semiconductor layer comprising p type $Cd_{0.2}Hg_{0.8}Te$. Reference numeral 13 designates an n type impurity doped layer. Reference numeral 14 designates a pn junction in the first semiconductor layer 11. Reference numeral 15 designates an n type impurity doped layer. Reference numeral 16 designates a pn junction at the second semiconductor layer. Reference numeral 17 designates a common p side electrode. Reference numeral 18 designates an N side electrode. Reference numeral 19 designates an n side electrode.

FIGS. 6(a)-6(c) show energy band diagrams of a heterojunction in the infrared detecting element of the photodetector of FIG. 5(a). FIG. 6(a) shows an energy band diagram in the area of the n type impurity doped layer 15 and the second semiconductor layer 12, and FIG. 6(b) shows an energy band diagram in the area of the n type impurity doped layer 15, the second semiconductor layer 12, the first semiconductor layer 11, and the second semiconductor layer 12. FIG. 6(c) shows an energy band diagram in the area of the N type impurity doped layer 13, the first semiconductor layer 11, and the second semiconductor layer 12.

Among the infrared rays incident to the infrared detector element of such a structure, those of 3 to 5 microns are absorbed by the first semiconductor layer 11 of wide energy band gap, and those of 10 microns wavelength transmit the first semiconductor layer 11 and are absorbed by the second semiconductor layer 12 of narrower energy band gap. Carriers exited by the infrared rays of 3 to 5 microns in wavelength and absorbed by the first semiconductor layer 11 below the n side electrode 19 are detected between the n side electrode 19 and the common p side electrode 17 after following the path shown in FIG. 6(b). Carriers exited by the infrared rays of 10 microns wavelength and absorbed by the second semiconductor layer 12 below the n side electrode 19 are detected at a region between the n side electrode 19 and the common p side electrode 17 after following the path shown in FIG. 6(a). Carriers exited by the infrared rays of 3 to 5 microns wavelength and absorbed by the first semiconductor layer 11 below the N side electrode 18 are detected at a region between the N side electrode 18 and the common p side electrode 17 after following the path shown in FIG. 6(c). The infrared rays of 10 microns wavelength incident to below the N side electrode 18 transmit the first semiconductor layer 11 and are not detected.

From the above, at below the n side electrode 19, the infrared rays of 10 and 3 to 5 micron wavelengths are detected and only those of 3 to 5 microns wavelength are detected below the N side electrode 18.

Such a photodetector device is combined with silicon charge coupled devices to produce a hybrid type solid state imaging device and is utilized in an infrared image tracking apparatus. By way, as a measure to avoid infrared image tracking, there is a method of using a high temperature material as a decoy. In FIG. 7, reference numeral 9 designates a target and reference numeral 10 designates a material other than the target which is used as decoy.

FIG. 8 is a diagram showing the dispersion of radiation of black body which is calculated from the Planck's law. From this figure, it is understood that both in the neighborhood of room temperature (about 300° K) and at high temperature (of about 1000° K) material emits infrared rays of 10 microns wavelength. Therefore, when an infrared detector element responsive to 10 microns wavelengths of $Cd_{0.2}Hg_{0.8}Te$ is used, it is impossible to distinguish the target 9 from the other material 10. Herein, as is understood from FIG. 8, the ratio of the infrared intensity between the 5 micron wavelength and 10 micron wavelength is 1:3 for a target of 300° K, but the ratio of the infrared intensity between the 5 micron wavelength and 10 micron wavelength is 10:1 when the other material is at 1000° K. Therefore it is possible to distinguish the target 9 and the other material 10 by taking the ratio of the output signal of the infrared detector element in the 3 to 5 microns wavelength band and that at the 10 micron wavelength.

In the prior art photodetector device, because the first semiconductor layer 11 and the second semiconductor layer 12 need be produced, a higher level of crystalline growth technique than if only one layer is grown is required. Furthermore, in order to enhance the degree of integration of pixels in the above-described construction, a film thickness of above 10 microns is required to improve the absorption coefficient sufficiently while giving consideration to the absorption coefficient ($10^3$ cm$^{-1}$) of the second semiconductor layer for the light of 10 microns wavelength where respective pixels are produced in 50 micron pitches. Therefore, the production of the device is impossible using only the fabrication techniques which are present applicable to the semiconductor devices.

SUMMARY OF THE INVENTION

It is an object of the present invention to provide a photodetector device comprising only one semiconductor layer that is produced by modern semiconductor fabrication techniques that easily enhances the degree of integration and easily recognizes whether the emitting material is high temperature or low temperature.

Another object of the present invention is to provide a photodetector device easily recognizing whether a target is at a high temperature or room temperature in a case where the wavelength dependency of the absorption coefficient of the semiconductor layer is large.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

According to a first aspect of the present invention, a photodetector device includes a first conductivity type semiconductor layer that is transparent to the incident light from the rear surface produced on a semi-insulating substrate. A second conductivity type semiconductor material is disposed in an array in the first conductive type semiconductor layer. Light absorption regions is disposed alternatingly on the second conductivity type semiconductor material. A metal electrode of high reflectance is disposed on the light absorption regions and the second conductivity type semiconductor material a protection film is disposed on the first conductivity type semiconductor layer, and a metal electrode contacting the first conductivity type semiconductor layer through an aperture in the protection film.

According to another aspect of the present invention, the thickness of one second conductivity type semiconductor layer in the direction of incident light is thinner than the other second conductivity type semiconductor layer, producing a difference in optical path length.

In accordance with the present invention, a photodetector device includes only one semiconductor layer and therefore, an integrable device is produced by conventional semiconductor fabrication techniques and whether a target is high temperature or room temperature can be easily recognized.

In accordance with the present invention, the n type impurity doped layer on which a light absorption layer is provided, corresponds to the distance of incident light and has a thickness less than the other n type impurity doped layer and different optical path lengths are provided between the n type impurity doped layers. The recognition ability is enhanced, and even when there is no difference dependent on the wavelength in the absorption coefficients of the semiconductor layer and the temperature of the material while utilizing the device in the infrared image tracking, whether the material is high temperature or room temperature can be easily recognized.

BRIEF DESCRIPTION OF THE DRAWINGS

FIGS. 6(a)–6(c) are energy band diagrams of the prior art photodetector device;

FIGS. 9(a)–9(j) are diagrams showing the production flow of the present invention.

DETAILED DESCRIPTION OF THE PREFERRED EMBODIMENTS

An embodiment of the present invention will be described in detail with reference to the drawings.

Figure 1A:
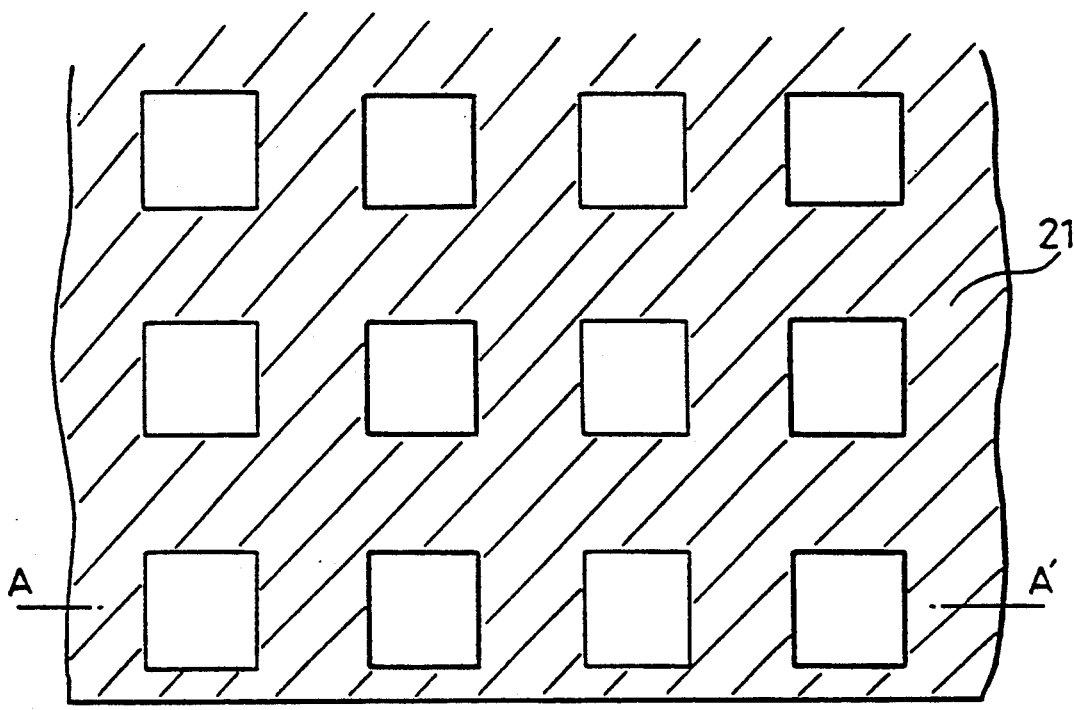
FIGS. 1(a) and 1(b) are a plan view and a cross-sectional view showing a photodetector device according to a first embodiment of the present invention.
Figure 1B:
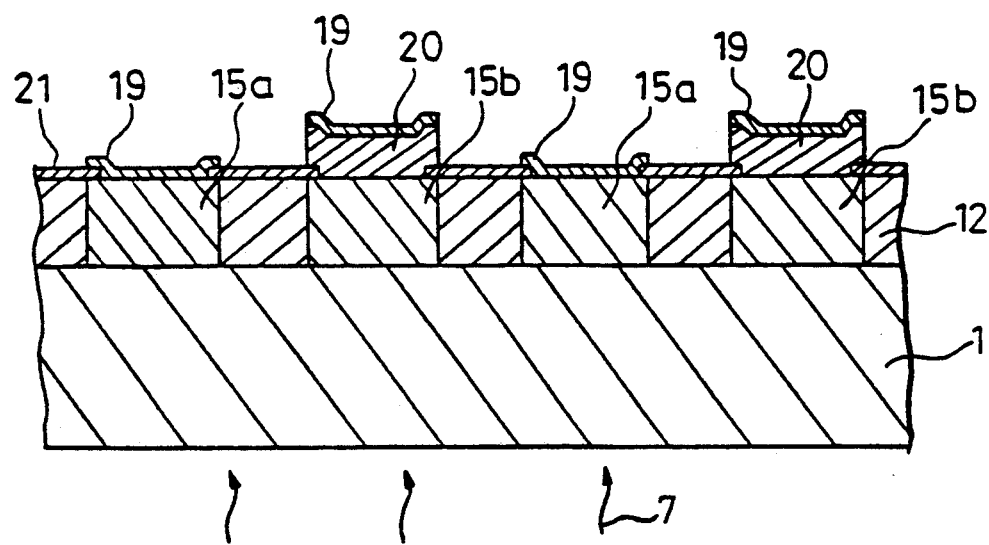
Figure 3:
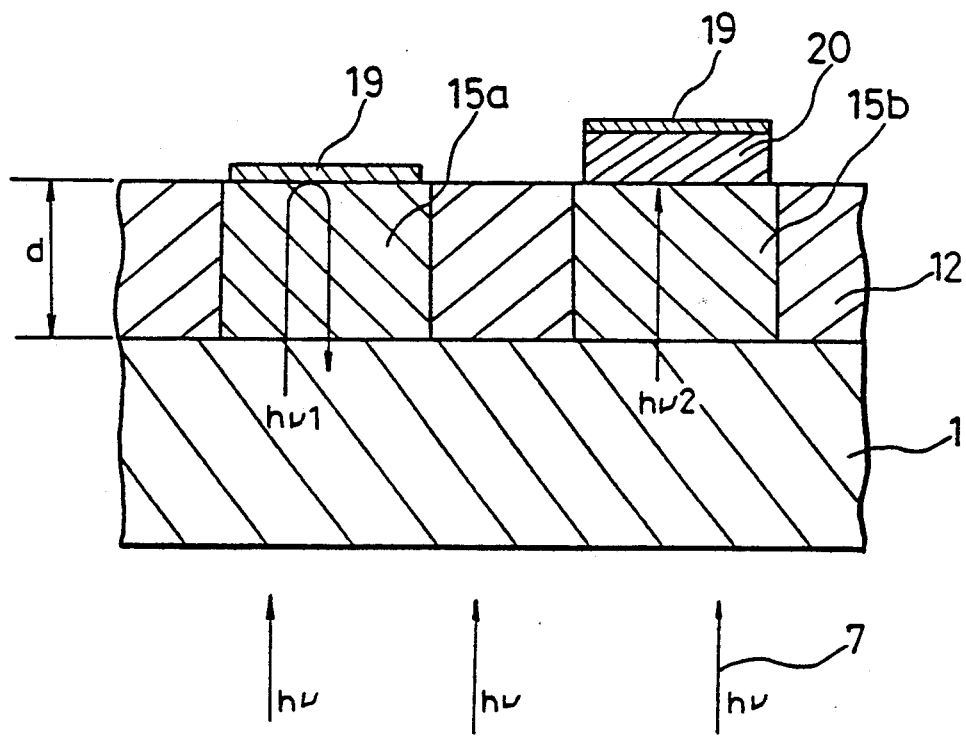
FIG. 3 is a cross-sectional view of the first embodiment of the present invention.
Figure 5A:
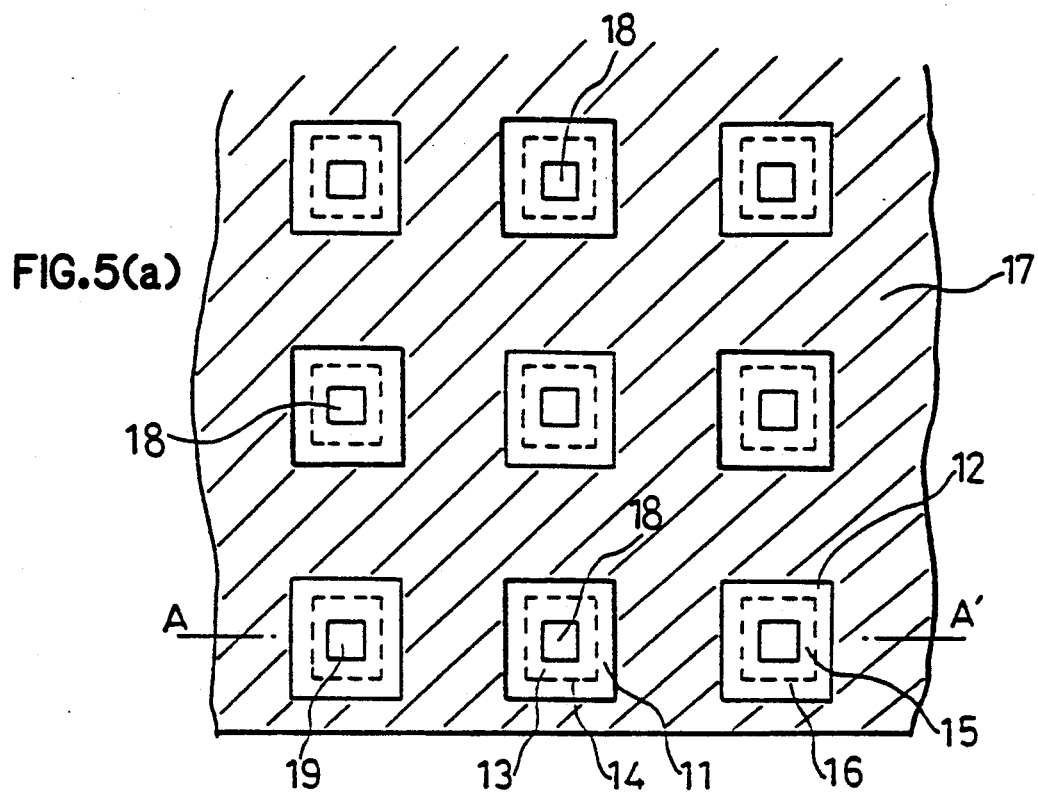
FIGS. 5(a) and 5(b) are a plan view and a cross-sectional view of a prior art photodetector device.
Figure 5B:
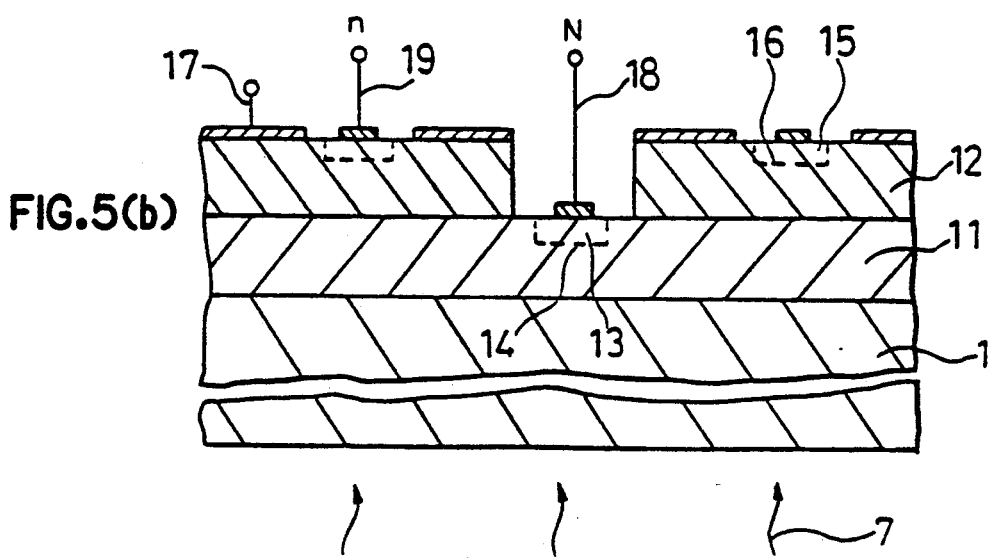
Figure 7:
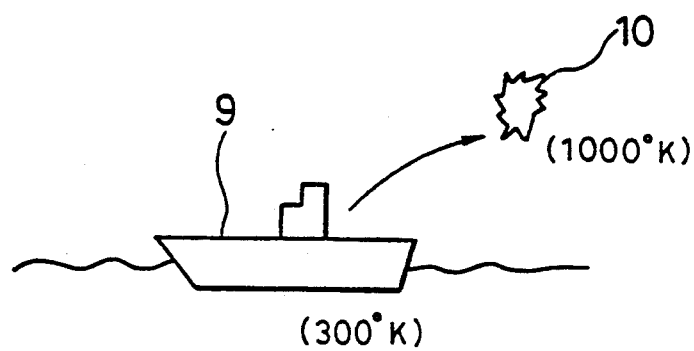
FIG. 7 is diagram showing a measure for avoiding infrared image tracking.

FIGS. 1(a) and 1(b) show a photodetector device in accordance with a first embodiment of the present invention. In those figures, the same reference numerals as those used in FIG. 5 designate the same or corresponding portions. Reference numeral 20 designates a conductive light absorption layer, and reference numeral 21 designates a protection film. In this embodiment, the light absorption layers 20 are produced alternatingly with the n type impurity doped layer 15. In other words, in the cross-sectional view of FIG. 1(b), the n type impurity doped regions 15 are divided into groups of alternating regions 15a and 15b. The light absorption layers 20 are disposed only on the n type impurity doped regions 15b with an n side electrode 19 disposed on each of the light absorption layers 20. The surface of the p type semiconductor layer 12 in which the n type impurity doped layers 15 are embedded is covered by a protection film 21. A p side electrode 17 is disposed on the p type semiconductor layer 12 at the edge of the photodetector. Further, the second conductivity type region which is to become a main light receiving region is constituted as shown in FIG. 3.

The production of the photodetector device of this first embodiment will be described with reference to FIGS. 9(a)–9(j).

Figure 9A:
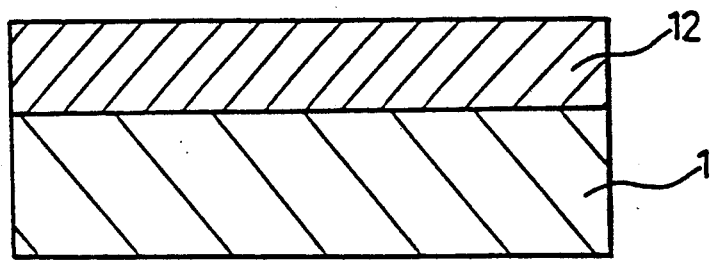
Figure 9B:
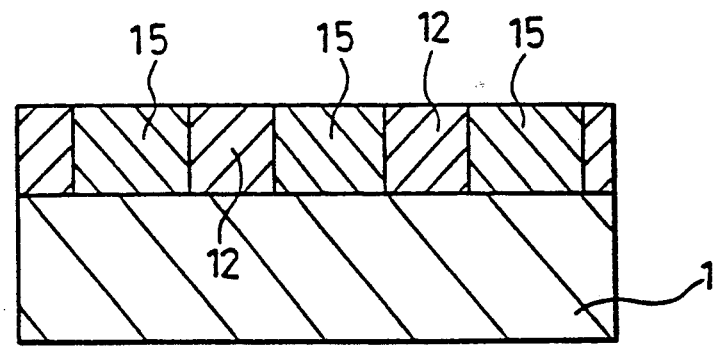
Figure 9C:
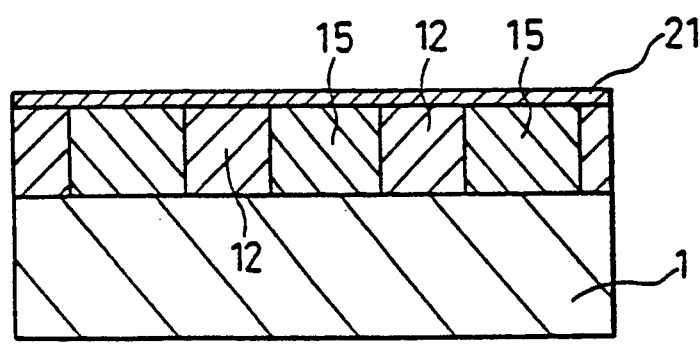
Figure 9D:
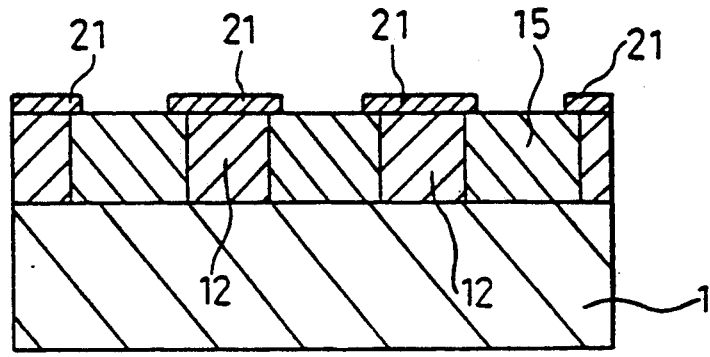
Figure 9I:
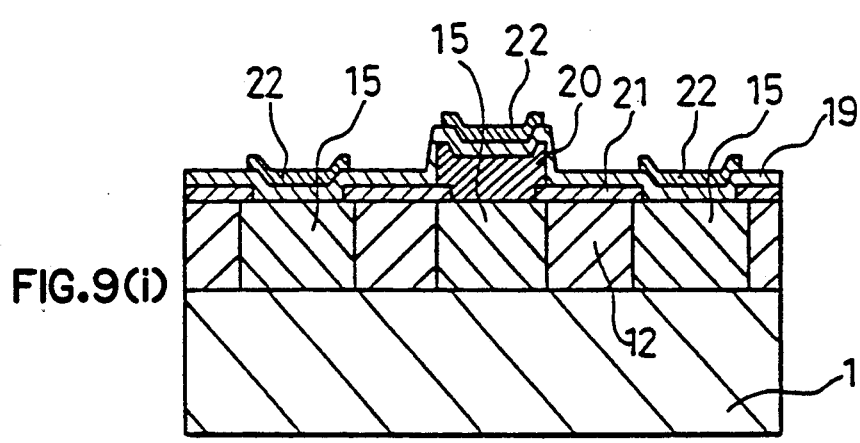
Figure 9J:
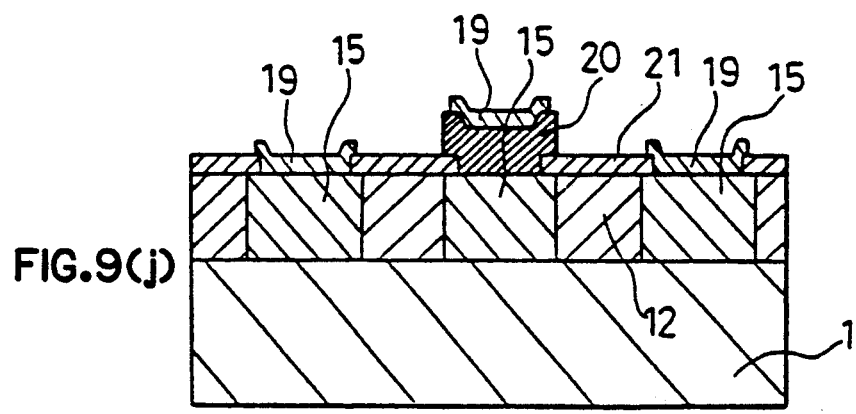

At first, as shown in FIG. 9(a), a P type CdHgTe layer 12 is epitaxially on a CdTe semi-insulating substrate 1. N type impurities are selectively placed in the P type CdHgTe epitaxy layer 12 on the CdTe substrate 1 by ion implantation or diffusion thereby to produce n type CdHgTe regions 15 as shown in FIG. 9(b). Then, as shown in FIG. 9(c), a protection film 21, for example, Zns or $SiO_2$, is produced on the entire surface. The protection film 21 on the n type CdHgTe region 15 is removed, thus obtaining a state shown in FIG. 9(d). Next, as shown in FIG. 9(e), a light absorption layer 20 is produced on the entire surface. When HgTe is used for this light absorption layer 20, infrared light below 10 microns in wavelength can be absorbed sufficiently when this absorption layer is about 3 microns in thickness. As shown in FIG. 9(f), photoresist 22 is produced at a concave part of the surface of the light absorption layer 20 in alternating concave parts which correspond to the openings of the protection film 21. Thereafter, an isotropic etching of such as ion milling is executed using the photoresist as a mask to remove parts of the light absorption layer 20 on which the photoresist 22 is not produced. Thereafter, the photoresist is removed. Thus, as shown in FIG. 9(g), the light absorption layer 20 is produced only on alternating n type CdHgTe regions 15. Next, as shown in FIG. 9(h), an n side electrode metal 19, such as chromium, is produced on the entire surface of the device, and as shown in FIG. 9(i), a photoresist 22 is produced on the electrode metal 19 on all the n type CdHgTe region 15 regardless of the presence of the light absorption layer 20. Finally, the metal electrode 19 is etched and the photoresist 22 is removed, resulting in a photodetector device in which there are provided an n type CdHgTe region 15 on which the light absorption layer 20 and the electrode metal 19 are produced and an n type CdHgTe region 15 on which only the metal electrode 19 is produced. Thereafter, an aperture is opened in the protection film 21 on the p type semiconductor layer at the edge of the photodetector and a metal, such as gold, is deposited on the p-type semiconductor 12 through the aperture to form the p side electrode 17.

Next, a description is given of the operation of the photodetector device which is produced as described above.

Figure 4:
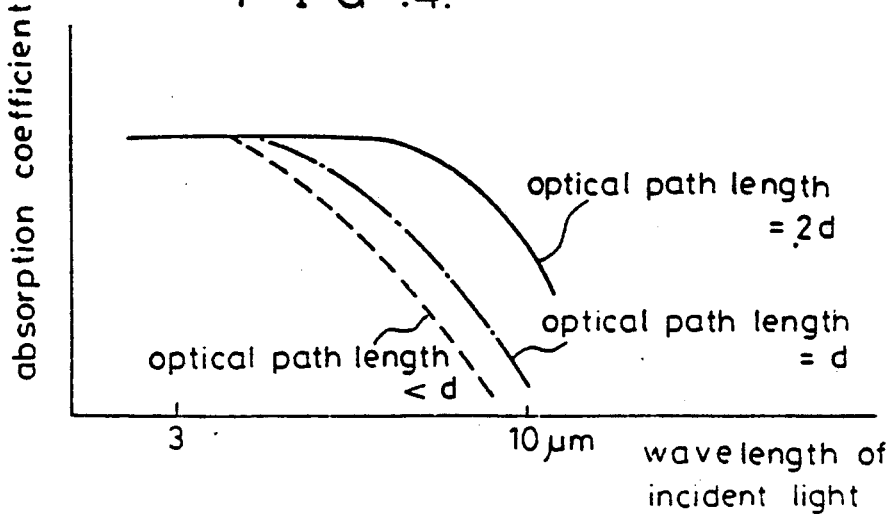
FIG. 4 is a diagram exemplifying the absorption coefficient and operation of the present invention.
Figure 8:
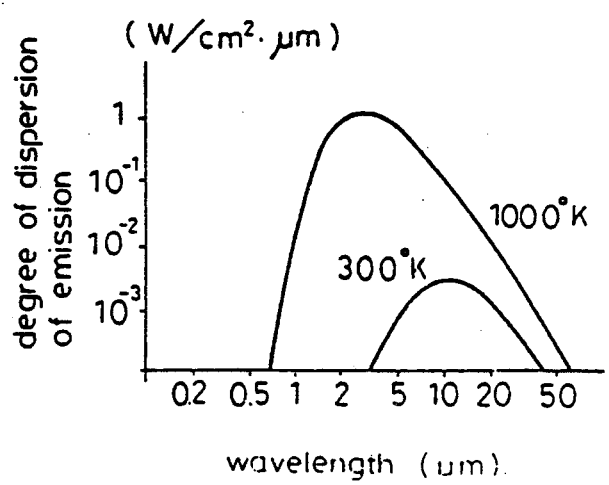
FIG. 8 is a diagram showing the emission of a black body.

FIG. 3 shows that the incident light $h\nu 1$ is reflected by the metal electrode 19 at the second conductive type region 15a where the light absorption region 20 is not present. Herein, when the layer thickness of the first conductivity type semiconductor layer 12 is d, the optical path length which can absorb light becomes 2d because the light is reflected. Furthermore, because the light $h\nu 2$ is absorbed by the light absorption layer 20 at the second conductivity type semiconductor region 15b where the light absorption layer 20 is present, the optical path length which can absorb the light is d. Due to such difference in the optical path length, the characteristics of the absorption coefficient of incident light as a function of wavelength varies as shown in FIG. 4. Further, as shown in FIG. 8, the radiation from a thermal source at a high temperature such as 1000° K has a peak in the vicinity of 3 microns. On the other hand, the absorption coefficient in the vicinity of 3 microns has almost no difference as a function of different optical path lengths which is caused by the second conductivity type regions 15a and 15b as shown in FIG. 4. Therefore there arises no difference in the electric outputs of the both regions 15a and 15b for infrared light received from a high temperature body.

However, the radiation at room temperature of about 300° K has a peak in the vicinity of 10 microns and has a large difference in the absorption coefficient depending upon path length. Therefore, a difference in the electric outputs of the second conductivity type semiconductor regions 15a and 15b arises. Therefore, by detecting the electric outputs of both the adjacent second conductivity type semiconductor regions, it is possible to distinguish whether the target material is at high temperature or not.

A description is given of the operation of the photodetector device constituted as described above.

At first, when $Cd_{0.2}Hg_{0.8}Te$ crystal is used for the p type semiconductor layer 12, the infrared rays of wavelength shorter than about 10 microns are absorbed to generate carriers. The infrared rays which are incident from the rear surface is absorbed by the n type impurity doped layer 15a but the infrared rays which are not absorbed are reflected by the metal electrode 19 and are again absorbed by the n type impurity doped layer 15a. However, although the incident infrared rays 7 are absorbed by the n type impurity doped layer 15b at the n type impurity doped layer 15b portion, those which have reached the light absorption layer 20 comprising such as HgTe are almost absorbed by the light absorption layer 20 or are lost due to the short carrier lifetime in the HgTe. Therefore, they do not contribute to an electric signal. As such, the n type impurity doped layer 15a has an optical path length for absorbing the infrared rays 7 of about two times as that of the n type impurity doped layer 15b.

Not only $Cd_{0.2}Hg_{0.2}Te$ but almost all the semiconductor have an absorption coefficient for absorbing light that decreases as the wavelength of the light increases. The absorption coefficient of light of longer wavelength is inferior as the optical path length decreases as shown in FIG. 4. That is, when the light from the target material at irradiates 1000° K the photodetector device of the present invention, the wavelength peak is about 3 microns as seen from FIG. 8, showing almost no difference in the absorption coefficient between the n type impurity doped layer 15a and the n type impurity doped layer 15b. Therefore, the electric outputs which are generated from the n type impurity doped layer are all the same. However, when the light from a target material at room temperature of 300° K is irradiated, as is apparent from FIGS. 4 and 8, the wavelength peak is about 10 microns and the absorption coefficients in the vicinity of 10 microns of the n type impurity doped layer 15b and 15b are different and therefore, the electric signal outputs from the n type impurity doped layers are different. Therefore, the determination of whether the temperature of the object material to be detected is high or low can be easily determined by comparing the electric outputs of the adjacent n type impurity doped layers.

In the above-illustrated embodiment HgTe is used for the light absorption layer 20, but the present invention is not limited thereto. The light absorption layer may be any material having good electrical conductivity, high light absorption coefficient, short lifetime of generated carriers, and making a superior ohmic contact with the n type impurity doped layer.

Furthermore, the photodetector device of the present invention has an advantage with respect to the following problem in the prior art device. When the room temperature material is a target material in the FIG. 5 prior art device, although the n type layer 15 is sensitive to the room temperature target, the n type impurity doped layer 13 is not sensitive to the room temperature material. Therefore, when the FIG. 5 device is used as a solid state imaging element, unless the pitch of the n type impurity doped layer is small and the layer is produced at a high density, good sensitivity is not obtained. When the impurity doped layers are used as pixels, a picture image having a high resolution is not obtained.

However, in the present invention, there is no insensitive region as a function of a room temperature target and all regions are sensitive to the room temperature material, therefore quite a high resolution picture image is easily obtained.

In the above-illustrated embodiment the light absorption layer 20 is provided on the predetermined n type impurity doped layer 15 and the optical path length of the incident light which is absorbed is 1:2. Therefore, if the material constituting the semiconductor layer is replaced by another material having a smaller difference in the absorption coefficient as a function of the wavelength of material, or if there is only a small temperature difference between the target material and a background material, distinguishing the target of material is difficult. A second embodiment of the present invention which can respond to such case will be described.

Figure 2:
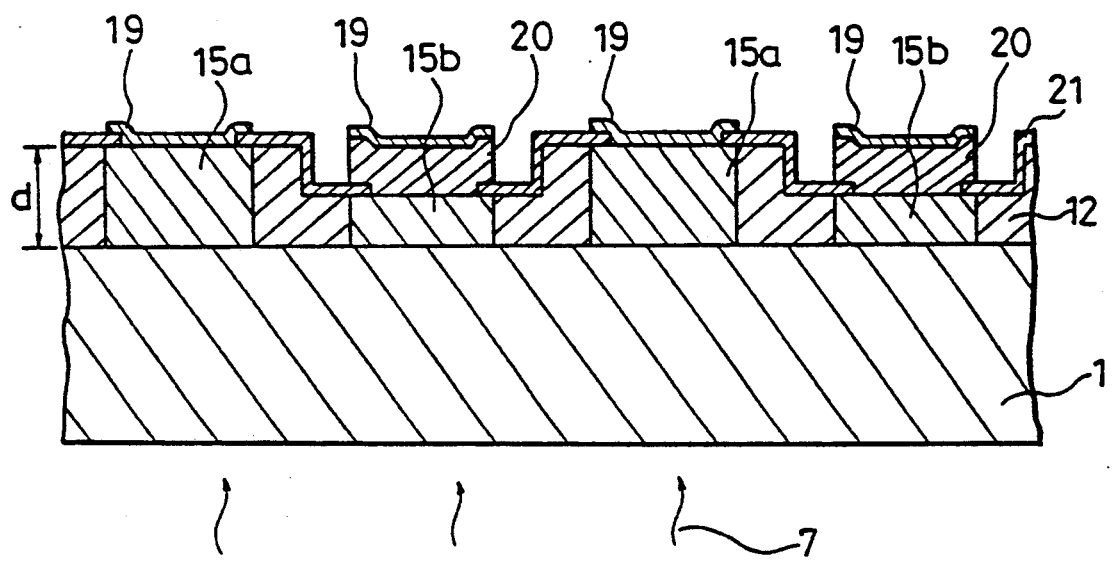
FIG. 2 is a cross-sectional view showing a second embodiment of the present invention.

In FIG. 2 showing such second embodiment, the layer thickness of the second conductive type semiconductor layer 15b on which the light absorption layer 20 is provided is made thin such that it is about a half layer thickness d/2 of a layer thickness d of the other second conductive type semiconductor layer 15a. A difference is provided between the distance along the path of the incident light between the second conductive type semiconductors 15a and 15b.

Herein, in the relation between the absorption coefficient and the wavelength of the incident light, as shown in FIG. 4, the absorption coefficient where the optical path length is shorter than d has a much greater difference in the inclination of the curve than a case where the absorption coefficient of the optical path length is equal to d. Thus, by adopting the above-described structure, the difference is further increased in the absorption coefficient as shown in FIG. 4, and the recognition ability is enhanced. Even when the temperature difference is small, it is possible to easily distinguish the target object and the background material, meaning that the recognition ability is further enhanced.

While in the above-illustrated embodiment second conductive type semiconductor layers are arranged in each column in accordance with the presence of the light absorption layer as shown in FIG. 1(a), the present invention is not limited thereto. Then, they can be arranged such that the mutual output currents ar compared.

As is evident from the foregoing description, according to the present invention, a photodetector device includes first conductivity type semiconductor regions provided on a semi-insulating substrate which is transparent to the incident light, second conductivity type semiconductor regions provided on the semi-insulating substrate alternating with the first conductivity type semiconductor region, a light absorption layer produced on every other second conductivity type semiconductor layer, a metal electrode having a high reflectance of the incident light produced on the light absorption layer and the second conductivity type semiconductor region, and a protection layer produced on the first conductivity type semiconductor region. Therefore, the device includes only one semiconductor layer, and a device in which the degree of integration is easily enhanced even by the conventional semiconductor fabrication process can be obtained. By using this device, a high temperature target and a room temperature target can be easily distinguished.

According to the present invention, a layer thickness corresponding to the distance of travel of the incident light in the n type impurity doped layer in which the light absorption layer is produced is thinner than the other n type impurity doped layer portion. The difference in the optical path length between the two kinds of second conductivity type semiconductors, enhances the recognition ability. Therefore, even when there is no difference in the absorption coefficient of the semiconductor layer as a function of the wavelength of incident light or even when there is less difference in the target temperature while the device is utilized in an infrared video image tracking apparatus, the high temperature target and room temperature target can be easily distinguished.

What is claimed is:

1. A photodetector device comprising:
   a semi-insulating substrate transparent to incident light;
   a plurality of second conductivity type semiconductor regions disposed on and contacting said substrate and a first conductivity type, opposite the second conductivity type, semiconductor layer disposed on and contacting said semiconductor substrate and disposed between and contacting said second conductivity type regions;
   an electrically conductive light absorption layer for absorbing light and having a light absorption coefficient that varies with light wavelength disposed on at least one of said second conductivity type semiconductor regions opposite said substrate;
   metal electrodes having a high reflectance for the incident light disposed on said light absorption layer and on said second conductivity type semiconductor regions where said light absorption layer is not present opposite said substrate; and
   a protection layer disposed on said first conductivity type semiconductor layer opposite said substrate and contacting said second conductivity type regions.

2. A photodetector device as defined in claim 1 wherein said second conductivity type semiconductor region on which said conductive light absorption layer is disposed is thinner than the other second conductivity type semiconductor regions whereby a difference in optical path lengths of said two second conductivity type semiconductor regions is achieved.

3. A photodetector device as defined in claim 1 wherein said semi-insulating substrate comprises CdTe, said second conductivity type semiconductor regions comprise n type CdHgTe, said first conductivity type semiconductor layer comprises p type CdHgTe, and said conductive light absorption layer comprises HgTe.

4. A photodetector device as defined in claim 1 wherein the thickness of said second conductivity type semiconductor region on which said conductive light absorption layer is disposed is substantially the same thickness as that of the other second conductivity type semiconductor regions.

* * * * *